United States Patent [19]

Flugan

[11] Patent Number: 4,585,995
[45] Date of Patent: Apr. 29, 1986

[54] NUCLEAR MAGNETIC RESONANCE EDDY FIELD SUPPRESSION APPARATUS

[75] Inventor: David C. Flugan, Hudson, Ohio

[73] Assignee: Technicare Corporation, Solon, Ohio

[21] Appl. No.: 601,897

[22] Filed: Apr. 19, 1984

[51] Int. Cl.⁴ ............................................. G01R 33/22
[52] U.S. Cl. ...................................... 324/322; 324/318
[58] Field of Search ............... 324/300, 307, 309, 314, 324/318, 320, 322

[56] References Cited

U.S. PATENT DOCUMENTS 4,442,404  4/1984  Bergmann ........................... 324/309
4,490,675  12/1984  Knuettel et al. ..................... 324/318

OTHER PUBLICATIONS

"Operators Instructions for Whole Body Superconducting Magnet and Field Gradient Set", Oxford Instruments Ltd., Aug. 1980.

*Primary Examiner*—Michael J. Tokar
*Assistant Examiner*—Kevin D. O'Shea
*Attorney, Agent, or Firm*—W. Brinton Yorks, Jr.

[57] ABSTRACT

Compensation is provided for a gradient field of an NMR imaging system which compensates for the effects of eddy fields developed in the static magnetic field from metallic components during gradient field switching. The compensation comprises providing current overshoot to the gradient coil during gradient switching. The overshoot current decays with a time constant chosen to substantially offset the decay of eddy fields following gradient switching. In a preferred embodiment, a time constant network representative of eddy field decay is coupled in combination with a feedback signal from a current sampling resistor of the gradient coil.

14 Claims, 6 Drawing Figures

NUCLEAR MAGNETIC RESONANCE EDDY FIELD SUPPRESSION APPARATUS

This invention relates to nuclear magnetic resonance (NMR) imaging systems and, in particular, to the suppression of eddy fields which oppose gradient fields during field switching.

In NMR imaging systems, the spin moments of nuclei within the subject being imaged are selectively modified, or "encoded", by gradient magnetic fields so that the phase and frequency of emitted NMR signals will provide positional information about the nuclei. Gradient fields are magnetic fields which vary in sense and/or degree as a function of the space in which the subject being imaged is located. The gradient fields are imposed on the static magnetic field of the NMR imaging system, and generally are made to vary linearly, for ease of data interpretation, in all three dimensions.

The gradient fields are usually not applied simultaneously, but are applied in a timed sequence, with those fields applied before data acquisition performing a phase encoding of the NMR signals, and those applied during acquisition performing frequency encoding. For most image reconstruction techniques it is desirable to perform many data acquisitions, each of which involves a sequence of gradient field encodings. To enable the reconstruction of images which are not blurred, and to acquire image information from a plurality of planes during a single sequence of gradient field encodings, it is desirable to generate and remove field gradients as efficiently as possible.

However, it is necessary for the gradient fields to stabilize in order to reliably encode the spin moments in the desired manner. Specifically, the gradient fields will not instantaneously stabilize when they are switched on; a finite amount of time is required for the fields to become stable.

The gradient fields are generated by switching currents in gradient coils which surround the subject being imaged. When current is switched into a coil to generate a gradient field, the gradient magnetic field builds rapidly toward the desired field strength. But as it does so, the changing magnetic field induces other currents called eddy currents in closed-loop conductors within the field. The eddy currents in turn generate their own eddy fields, which oppose the changing magnetic field, as eddy fields will oppose any changing magnetic field. The effective magnetic field then is the difference between the magnetic field developed by the gradient coil and the eddy current field.

As the gradient field approaches its desired field strength, its rate of change begins to decline, leading to a decline in the induced eddy currents. The eddy fields will then decay exponentially as the gradient field begins to stabilize. The net result is that the effective magnetic field increases exponentially to its final, stable level.

In accordance with the principles of the present invention, compensation is provided for a gradient field of an NMR imaging system which suppresses the eddy fields developed during gradient field switching. The compensation technique comprises providing excess current to the gradient coil initially at the moment it is activated. This excess or overshoot current causes the initial current applied to the gradient coil to exceed the final, stabilized current by a predetermined amount. Following the time of field activation, the excess current is reduced in accordance with a predetermined response characteristic. The net effect of the controlled current overshoot and reduction is a magnetic field which increases rapidly to its final, stabilized value with substantial compensation of eddy field effects. Without compensation the gradient field strength has been found to vary by as much as 10% to 20% during data collection. With the compensation technique of the present invention, the gradient field variation is less than 2% from the desired field strength, providing a noticeable improvement in image quality.

In accordance with a further aspect of the present invention, a gradient signal is applied to a gradient coil amplifier, which provides the desired current to the gradient coil. The current flowing through the coil is sampled and fed back to an input of the amplifier to form a closed loop feedback arrangement.

A particular NMR system may have several conductors in the gradient field which can act as eddy current sources. Accordingly, for more precise eddy current compensation, it is desirable to provide an eddy current compensation response characteristic with multiple time constants to compensate for the effects of different eddy current sources. In accordance with the principles of yet a further aspect of the present invention, circuitry exhibiting the compensating time constant or time constants of one or more eddy current sources is included in the feedback path of the gradient coil amplifier to compensate for the effects of the eddy current source or sources.

In an NMR imaging system, the field generated by an eddy current decays exponentially with a time constant that depends on the shape and conductivity of the conductor in which the current is confined. In the case of an NMR imaging system using a superconducting magnet for generation of the static magnetic field, the bore of the magnet is conventionally a cylindrical conductor. This bore tube is generally the most significant eddy current source in the imaging system, and will support an eddy current with a pattern whose geometry is quite similar to that provided by the cylindrical shape of the gradient coils. Therefore the eddy field will oppose the effective gradient field without significantly changing its distribution.

Figure 1:
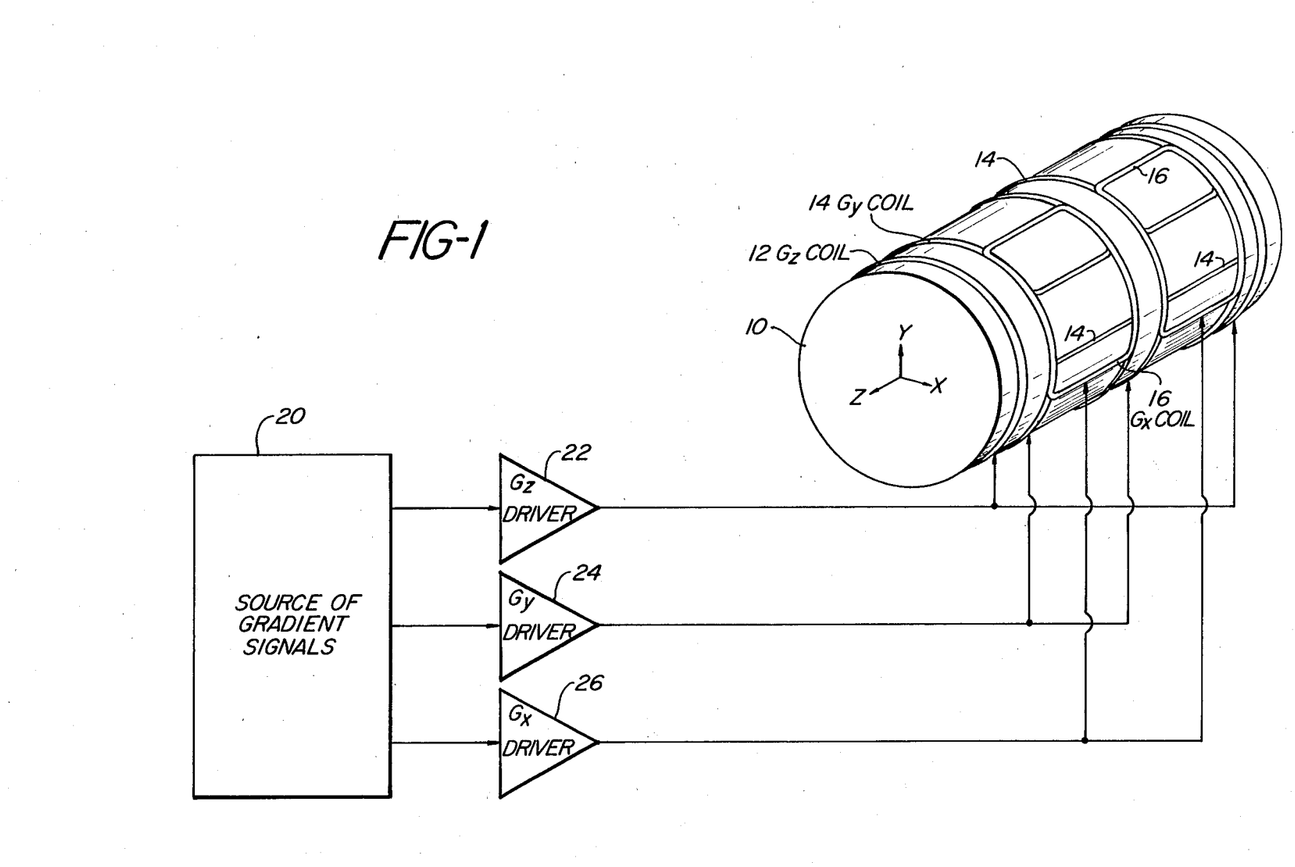
FIG. 1 illustrates a schematic representation of the gradient coils and circuitry of an NMR imaging system.

The gradient coils are conventionally formed around a cylindrical nonmetallic coil form which fits within the bore tube, such as the coil form 10 shown in FIG. 1. FIG. 1 shows, in highly schematic form, three gradient coils for producing gradient fields in the x, y and z directions. The z direction is generally taken to be the axis of the concentric coil form and magnet bore, as shown by the axes arrows of FIG. 1. Two circular coils 12 provide the gradient field component in the z direction, $G_z$. Two pairs of saddle-shaped coils 14 located generally on the top and bottom of the coil form 10 provide the y direction gradient field component $G_y$. Two pairs of saddle-shaped coils 16 located generally on the sides of the coil form 10 provide the gradient field component $G_x$ in the x direction. Two of the $G_x$ coils 16 are not visible in FIG. 1, since they are located on the back side of the coil form 10 as it is shown in the FIGURE.

A source of gradient signals 20 provides signal waveforms for the $G_x$, $G_y$ and $G_z$ gradient coils. The gradient signal source is usually computer-controlled, since the gradient signals are generally precisely timed pulse waveforms. The gradient signals are applied to the coils by $G_x$, $G_y$ and $G_z$ drivers 22, 24 and 26.

Figure 2:
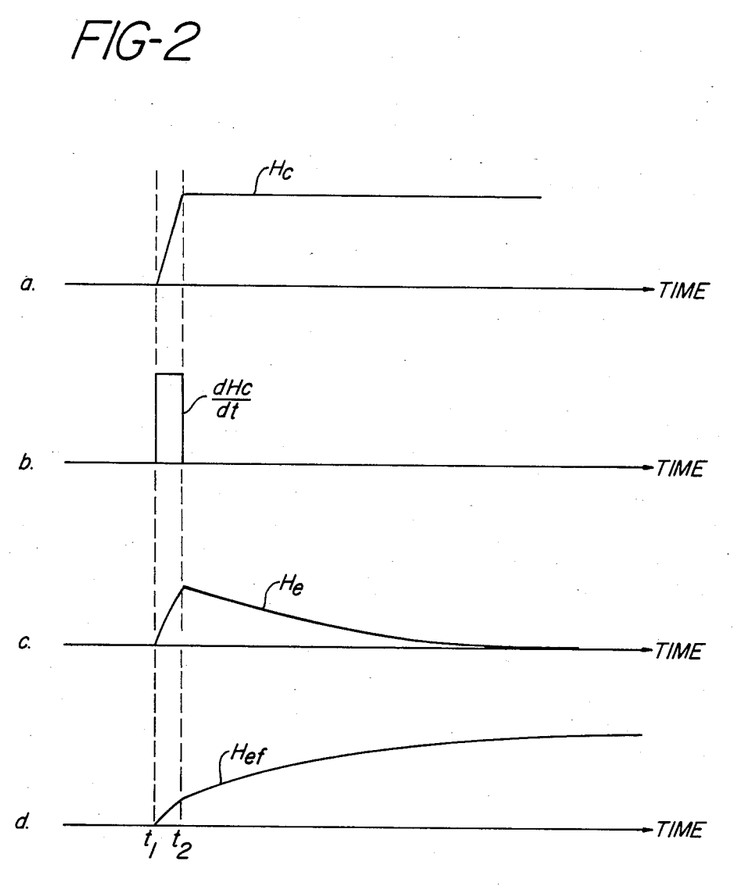
FIG. 2 illustrates response curves of an uncompensated gradient coil system.

FIG. 2 illustrates the relation between the magnetic field generated by the gradient coil, the eddy field and the effective field as a function of time for a representative point in the field volume of a typical uncompensated gradient coil arrangement. FIG. 2a illustrates a gradient drive current waveform $H_c$, having a constant slew rate during the initial time interval $t_1$–$t_2$. Thereafter the drive current maintains a substantially constant level for the remaining duration of the gradient field. FIG. 2b illustrates the change in the magnetic field generated by the gradient coil, $dH_c/dt$. The eddy field $H_e$ responds exponentially to the changing gradient field as shown in FIG. 2c, increasing during the time interval $t_1$–$t_2$, and decaying exponentially thereafter. The response characteristic of the effective magnetic field $H_{ef}$ is shown in FIG. 2d, and is the difference between the $H_c$ and $H_e$ curves. Provided the geometries of the $H_c$ and $H_e$ current sources are both substantially the same, i.e., both cylindrical, the response characteristics at other points in the field volume will differ from the curves of FIG. 2 only by a constant of proportionality.

Figure 3:
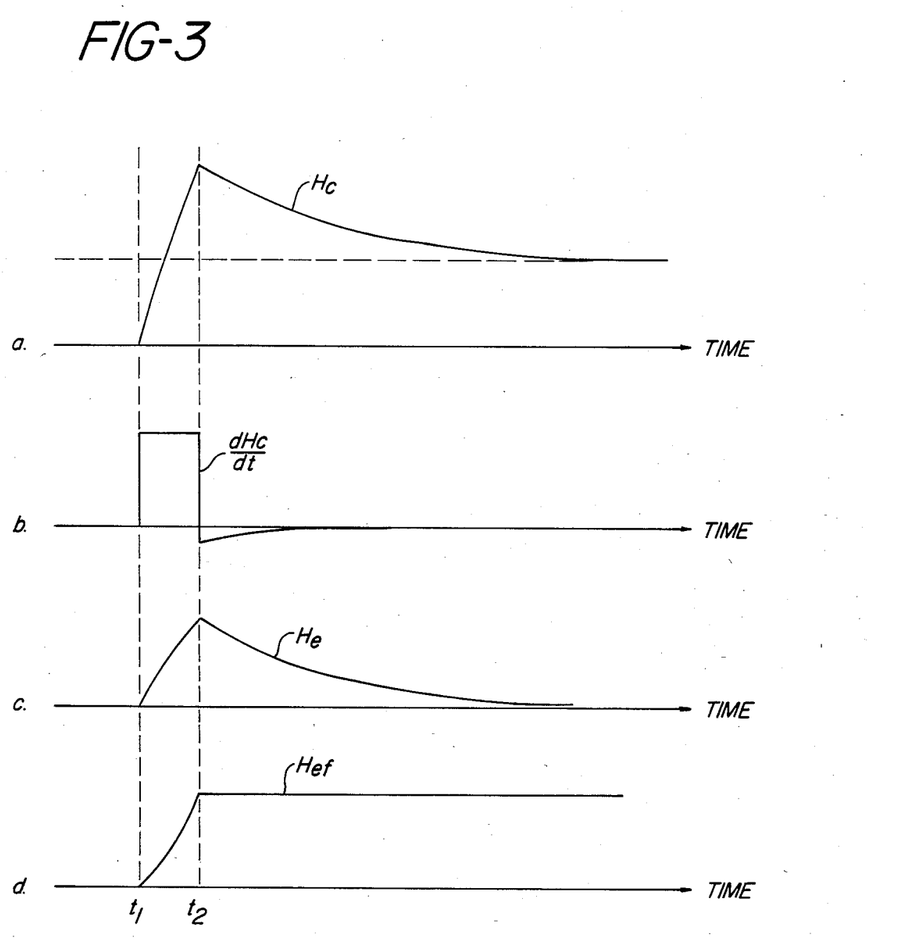
FIG. 3 illustrates response curves of a gradient coil system compensated for eddy field effects in accordance with the principles of the present invention.

The principle of the compensation technique of the present invention is illustrated by the curves of FIG. 3. Instead of simply slewing the gradient coil current from zero to the desired stable level, the coil current is slewed to a level higher than the stable level, then exponentially reduced thereafter, as shown by the $H_c$ curve of FIG. 3a. The change in the magnetic field is shown by the differential curve $dH_c/dt$ of FIG. 3b, which produces the eddy field $H_e$ of FIG. 3c. The effective magnetic field $H_{ef}$ is the difference between the $H_c$ and $H_e$ curves, and is shown in FIG. 3d. The $H_{ef}$ field is seen to be substantially stable following the initial time interval $t_1$–$t_2$.

The strength of the effective field is a function of the coil current i and of time, and is given by $$H_{ef}(t) = i(1 - Ke^{-t/\tau}),$$

where K and $\tau$ are time constants determined by characteristics of the conductors in the magnetic field, such as geometry and resistance. In a given constructed embodiment, the values of these constants may be determined empirically by adjusting the coil drive current and observing the resulting flux lines in the gradient field until the flux lines make a rapid and smooth transition to a stable final value.

If the final level of the effective field is to be a normalized value of 1, for instance, the above equation is solved for the current i, which yields $$i = 1/(1 - Ke^{-t/\tau}) = 1 + Ke^{-t/\tau} + (Ke^{-t/\tau})^2 + (Ke^{-t/\tau})^3 + \ldots$$

The second and higher order terms of this expression become increasingly small as $K \approx \frac{1}{3}$ for a typical system and $e^{-t/\tau}$ assumes its maximum value of 1 at time $t_2$, the moment of peak coil current, and decreases thereafter. Thus, the higher order terms following $1 + Ke^{-t/\tau}$ are disregarded, which leaves only a small residue of uncorrected eddy current. In many instances this residual eddy field is small enough so that it is negligible at the time of data collection.

Figure 4:
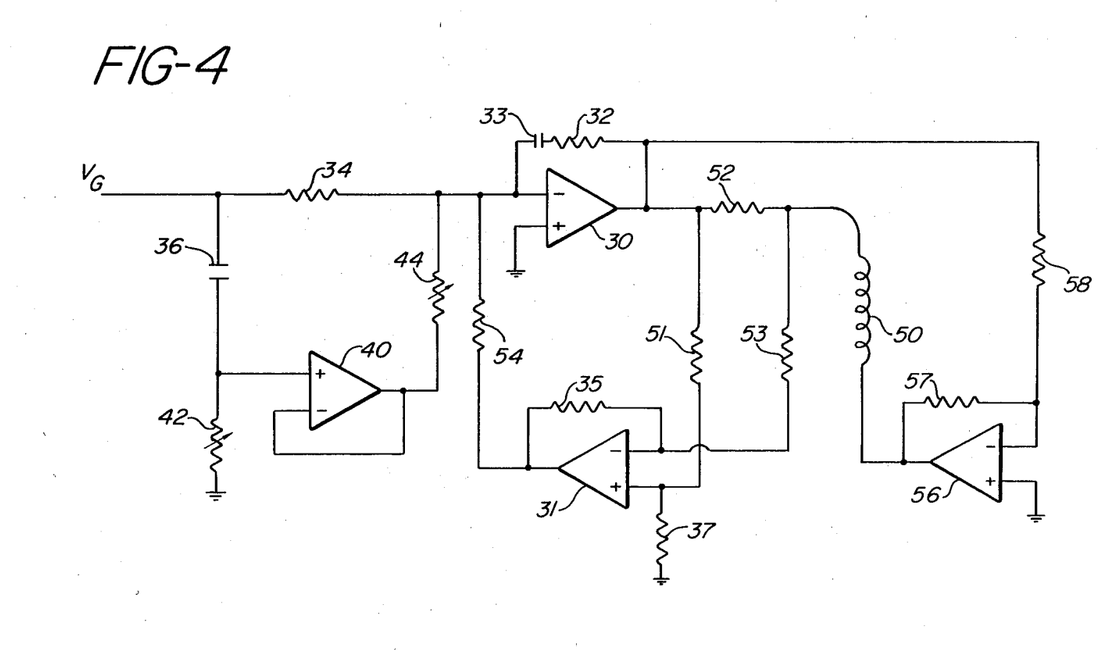
FIG. 4 illustrates gradient coil circuitry for providing the response characteristics of FIG. 3.

A circuit arrangement exhibiting the characteristic curves of FIG. 3 is shown in FIG. 4. In this arrangement, a compensating signal waveform is added to the desired gradient signal waveform. A gradient voltage waveform $V_G$ is applied to the inverting input of an amplifier 30 by way of an input resistor 34. A feedback resistor 32, coupled in series with a capacitor 33, determines the gain of the amplifier 30 in conjunction with the other circuit elements. The noninverting input of the amplifier 30 is coupled to a source of reference potential (ground). The output of the amplifier 30 is connected to supply current to a gradient coil 50. A current sampling resistor 52 is coupled in series with the gradient coil, and the output amplifier 30 is also coupled by a resistor 58 to the inverting input of an amplifier 56. The noninverting input of amplifier 56 is coupled to ground, and a feedback resistor 57 is coupled between the inverting input and the output of the amplifier. The output of amplifier 56 is coupled to the remaining end of the gradient coil 50. Amplifiers 30 and 56 drive the gradient coil 50 in a complementary fashion so that the coil will be quickly and uniformly energized.

The coil current flowing through the sampling resistor 52 is sensed by measuring the voltage differential across the resistor. Resistors 51 and 53 are coupled from opposite ends of resistor 52 to the opposite polarity inputs of a differential amplifier 31. A resistor 37 is coupled from the noninverting input of amplifier 31 to ground, and a resistor 35 is coupled from the inverting input to the output of the amplifier. By selecting resistors 51, 53, 35 and 37 to have equal values, the voltage across the sampling resistor 52, and hence the current flowing through it, is measured. This coil current measurement is applied to the input of amplifier 30 by a feedback resistor 54.

A capacitor 36 is coupled between the $V_G$ input of the circuit and the noninverting input of an amplifier 40. An adjustable resistor 42 is coupled between the noninverting input of amplifier 40 and ground. The output of amplifier 40 is coupled to the inverting input of the amplifier, and by way of an adjustable resistor 44 to the inverting input of amplifier 30.

In operation, a voltage step signal $V_G$ is applied to the input of the circuit of FIG. 4. In response to this signal, amplifier 30 is conditioned to apply a current step to the gradient coil 50. However, elements 36 and 40-44 augment the current step by providing an exponential decrease from the peak current at time $t_2$. Once the value of capacitor 36 has been chosen, variable resistor 42 is used to adjust the shape of the exponential decrease in current, which is the value of the $\tau$ time constant in the above equation. Adjustment of variable resistor 44 varies the magnitude of the decrease, which is the value of the K time constant in the equation.

In a particular embodiment of the compensation technique of the present invention, greater compensation accuracy may be desired. As mentioned above, the preceding arrangement is only an approximate, first-order compensation to a single eddy current source, since the higher order terms are neglected. It may be appreciated that the current flowing through a coil cannot be changed instantaneously. The step change in voltage $V_G$ will not result in an exact step change in coil current, but, as the curves of FIGS. 2 and 3 illustrate, will be subject to a slew rate increase together with a small overshoot and damping. Thus, the change in coil current will not exactly follow the programmed input signal $V_G$, and in FIG. 4 it is the programmed input signal which is applied to the time constant network. Greater accuracy would be obtained if the time constant network were responsive to the actual changing coil current.

Furthermore, when there is more than one conductor in the magnetic field of the gradient, a multiple time constant response may be necessary to compensate for the effects of the multiple eddy current sources. Without multiple time constants in the compensation circuitry, superior image quality cannot be expected in the presence of multiple eddy current sources.

Figure 5:
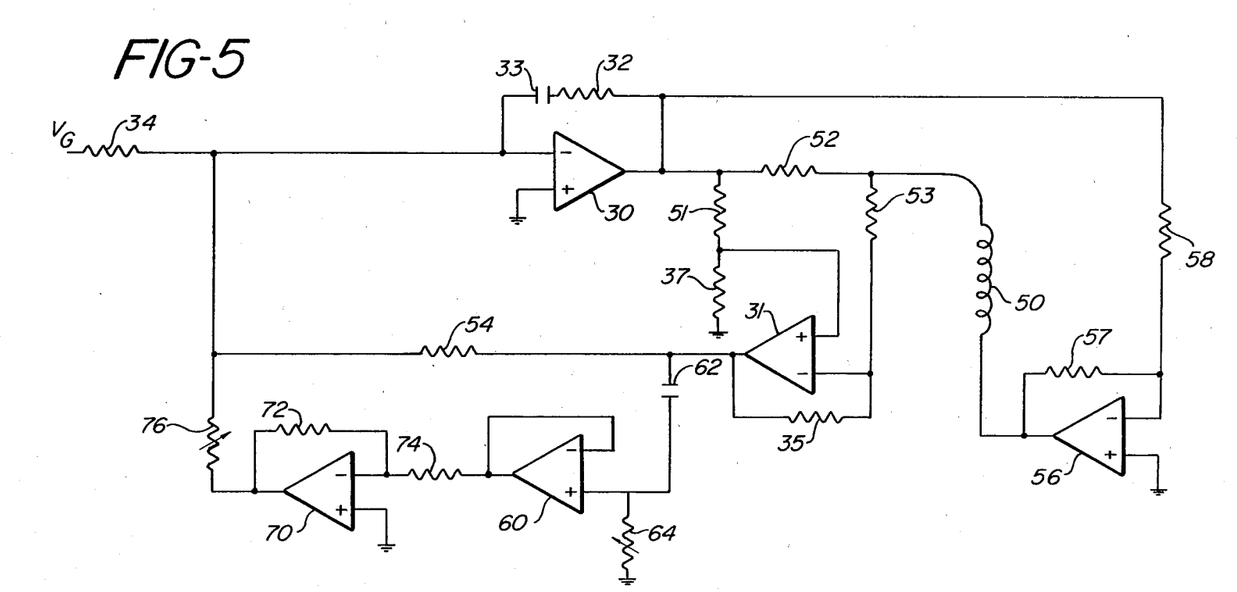
FIG. 5 illustrates gradient coil circuitry including eddy current compensation circuitry in a feedback loop.

The above concerns for improved gradient accuracy are addressed by placing the response time constants in a feedback loop which is responsive to the gradient coil current. Referring to FIG. 5, a feedback compensation circuit for a single eddy current source is shown. In this arrangement, a signal exhibiting a time constant representative of an eddy field is subtracted from a feedback signal which represents the gradient field.

As in the arrangement of FIG. 4, the gradient coil 50 is complementarily energized by amplifiers 30 and 56, and current sampling resistor 52 is coupled in series with the coil. The voltage differential across the sampling resistor 52 is again applied to amplifier 31, which provides a signal indicative of the actual gradient coil current. This coil current signal is applied to the input of amplifier 30 by feedback resistor 54.

A time constant network is coupled in parallel with the feedback resistor 54. A capacitor 62 is coupled between the output of amplifier 31 and the noninverting input of an amplifier 60. A variable resistor 64 is coupled between the noninverting input of amplifier 60 and ground. The inverting input of amplifier 60 is coupled to the output of the amplifier. The output of amplifier 60 is coupled by a resistor 74 to the inverting input of an amplifier 70. The noninverting input of amplifier 70 is coupled to ground, and the output of the amplifier is coupled to its inverting input by a resistor 72. The output of amplifier 70 is coupled to the inverting input of amplifier 30 by a variable resistor 76. With resistor 72 equal to resistor 74, amplifier 70 inverts the time constant signal supplied by amplifier 60, which is then subtractively combined with the feedback signal provided by resistor 54.

The operation of the time constant network of FIG. 5 may be expressed as:

$$\frac{V_G}{R_{34}} = -I_{coil}\frac{R_{52}}{R_{54}}\left(1 - \frac{R_{54}}{R_{76}}e^{-t/R_{64}C_{62}}\right)$$

For single eddy current source compensation, the magnetic field is:

$$H_{GRAD} = K_o I_{coil}(1 - Ke^{-t/\tau})$$

where K represents the amplitude of the eddy current field, and $\tau$ the time constant of the eddy current field.

Substituting the above expression into the preceding expression for $I_{coil}$ yields $$H_{GRAD} = -K_o\frac{V_G R_{54}}{R_{34} R_{52}}$$

when $R_{64} C_{62}$ is equal to $\tau$ and $R_{54}/R_{76}$ equals K of the eddy current field.

It is seen that the gradient field is directly proportional to $V_G$, which represents the desired magnetic field. Placing the time constant network in the feedback loop causes the compensation to be a function of the actual coil current, $I_{coil}$, and hence more accurate.

Figure 6:
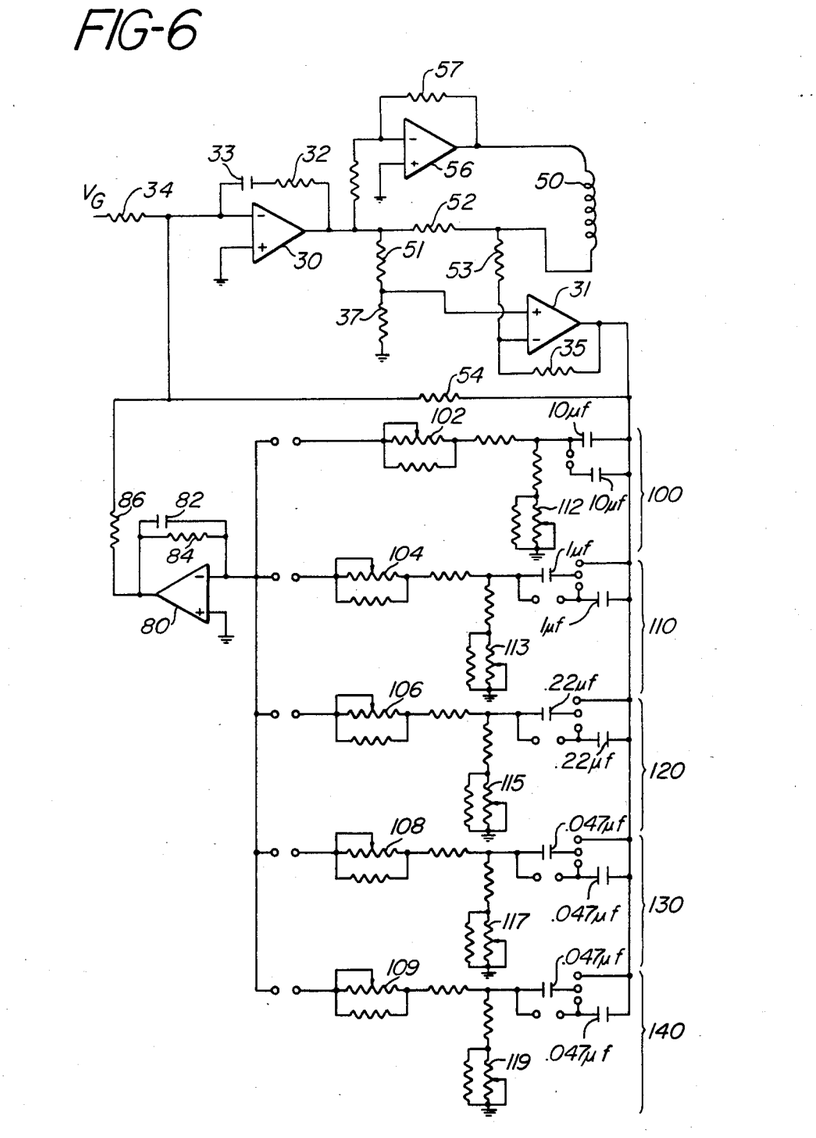
FIG. 6 illustrates gradient coil circuitry for compensating for the effects of a plurality of eddy current sources in accordance with the principles of the present invention.

The arrangement of FIG. 5 may be simplified and expanded to provide multiple time constants for multiple eddy current sources as shown by the arrangement of FIG. 6. In that FIGURE, five time constant networks 100, 110, 120, 130, and 140 are coupled in parallel with feedback resistor 54 between the output of amplifier 31 and the inverting input of an amplifier 80. Each time constant network includes several sets of terminals which may be shorted to selectively couple various network components into the circuit. Network 100, with 10 $\mu f$ capacitors, provides the longest time constant, and network 140, with its 0.047 $\mu f$ capacitors, provides the shortest time constant. In network 100, only one capacitor may be used, or the two 10 $\mu f$ capacitors may be connected in parallel for a longer time constant. A variable resistor 112 is then adjusted to finely vary the time constant. In networks 110, 120, 130 and 140, the two capacitors in each network may be coupled individually in the circuit, in series, or in parallel, with the group of three terminals being connected effectively as a single pole, double throw switch. Variable resistors 113, 115, 117 and 119 are used to finely adjust each time constant. Variable resistors 102, 104, 106, 108 and 109 may be varied to adjust the amplitude response of each time constant network. All time constant networks are responsive to the signal produced by amplifier 31, which signal is representative of the actual coil current of the gradient coil 50. Time constant signals are applied to amplifier 80, which inverts them for subtractive combining. The output signals of amplifier 80 are then combined with coil current representative feedback signals from resistor 54 and applied to the input of amplifier 30.

In actual applications of the arrangement of FIG. 6, it has been found that the use of three to five of the time constant networks satisfactorily represents the eddy current effects of the NMR imaging systems in which they have been applied. It has also been found that adjustment of the variable resistors usually does not have to be repeated for approximately six months, during which period the gradient system can be expected to remain stable and provide good image resolution.

The illustrated embodiments will also operate to compensate for eddy fields when the gradient fields are removed, or switched off. Since eddy fields develop to oppose any changing magnetic field, either one that is turning on or one that is turning off, eddy field compensation is important at the time of gradient termination so that the gradient and eddy fields will terminate promptly after the gradient coil current is switched off. At that time, the current being turned off will overshoot the quiescent or zero current level in the negative-going direction, and will be further compensated by a time constant or time constants in the circuit in the reverse sense as occurred during the turn-on sequences of FIG. 3. The gradient and eddy fields are thus rapidly terminated so that other steps in the NMR sequence may promptly proceed. Although the compensation techniques of the present invention are most useful during the application of step-type gradients, similar benefits also accrue during application of more slowly developing gradients from "soft" gradient pulses such as sin x/x pulses.

What is claimed is:

1. In a nuclear magnetic resonance imaging system, including a magnet for developing a main magnetic field, field gradient apparatus comprising:
   a gradient coil for applying a gradient to said main magnetic field; and
   means, coupled to said gradient coil, for energizing said coil, including means for applying a first current component to produce a desired stabilized field gradient, and means for applying a second current component substantially during the switching time of said first current component to compensate for the effect of an eddy field in said main magnetic field.

2. The nuclear magnetic resonance imaging system of claim 1, wherein development of said stabilized field gradient is opposed by said eddy field.

3. The nuclear magnetic resonance imaging system of claim 2, wherein said first current component exhibits a transition to a desired current level in a given sense relative to a quiescent current level, and wherein said second current component exhibits a transition in said given sense to a maximum current level substantially during said switching time.

4. The nuclear magnetic resonance imaging system of claim 3, wherein said second current component decays from said maximum current level with a decay characteristic representative of the effect of said eddy field.

5. The nuclear magnetic resonance imaging system of claim 1, wherein said energizing means comprises:
   an amplifier having an output coupled to said gradient coil;
   a switchable gradient signal source coupled to an input of said amplifier; and
   a time constant network, responsive to the switching of said switchable gradient signal source, coupled to an input of said amplifier.

6. The nuclear magnetic resonance imaging system of claim 5, wherein said switchable gradient signal source produces a signal representative of said desired stabilized field gradient; and wherein said time constant network has an input responsive to said signal produced by said gradient signal source and an output coupled to the same input of said amplifier as said gradient signal source.

7. The nuclear magnetic resonance imaging system of claim 5, further comprising a sampling resistor coupled in series with said gradient coil, and a feedback resistor coupled between said sampling resistor and an input of said amplifier.

8. The nuclear magnetic resonance imaging system of claim 5, further comprising a sampling resistor coupled in series with said gradient coil,
   wherein said time constant network is coupled between said sampling resistor and an input of said amplifier.

9. The nuclear magnetic resonance imaging system of claim 8, further comprising a feedback resistor coupled between said sampling resistor and an input of said amplifier.

10. In a nuclear magnetic resonance imaging system, including a magnet for developing a static magnetic field, field gradient apparatus for developing a gradient in said static magnetic field comprising:
    a gradient coil;
    an amplifier having an output coupled to said gradient coil;
    a source of gradient signals coupled to an input of said amplifier;
    a current sampling resistor coupled to sample the current in said gradient coil;
    a feedback resistor coupled between said current sampling resistor and an input of said amplifier; and
    a time constant network, which exhibits a decay time constant representative of an eddy field in said static magnetic field, coupled between said current sampling resistor and an input of said amplifier.

11. The nuclear magnetic resonance imaging system of claim 10, further including a signal inverter coupled in series with said time constant network,
    wherein signals produced by said time constant network are subtractively combined with feedback signals provided by said feedback resistor.

12. The nuclear magnetic resonance imaging system of claim 10, further comprising at least one further time constant network coupled in parallel with said first-named time constant network.

13. The nuclear magnetic resonance imaging system of claim 12, wherein each time constant network includes a resistor-capacitor time constant network, said time constant networks exhibiting respectively different time constants.

14. The nuclear magnetic resonance imaging system of claim 13, wherein each time constant network includes means for adjustably attenuating the signals produced by said respective time constant network.

* * * * *